United States Patent
Giriyappa et al.

(10) Patent No.: US 12,278,887 B2
(45) Date of Patent: *Apr. 15, 2025

(54) SYNCHRONIZING DEVICES USING CLOCK SIGNAL DELAY COMPARISON

(71) Applicant: Imagination Technologies Limited, Kings Langley (GB)

(72) Inventors: Ravichandra Giriyappa, Hemel Hempstead (GB); Vinayak Prasad, Bristol (GB); Oana Rosu, Watford (GB)

(73) Assignee: Imagination Technologies Limited, Kings Langley (GB)

( * ) Notice: Subject to any disclaimer, the term of this patent is extended or adjusted under 35 U.S.C. 154(b) by 259 days.

This patent is subject to a terminal disclaimer.

(21) Appl. No.: 16/861,619

(22) Filed: Apr. 29, 2020

(65) Prior Publication Data

US 2020/0259631 A1  Aug. 13, 2020

Related U.S. Application Data

(63) Continuation of application No. 15/261,652, filed on Sep. 9, 2016, now Pat. No. 10,680,793.

(30) Foreign Application Priority Data

Sep. 9, 2015 (GB) .................................. 1515956

(51) Int. Cl.
*H04L 7/033* (2006.01)
*H03K 5/15* (2006.01)
*H04L 7/00* (2006.01)

(52) U.S. Cl.
CPC ....... *H04L 7/0331* (2013.01); *H03K 5/15046* (2013.01); *H04L 7/0033* (2013.01);
(Continued)

(58) Field of Classification Search
CPC ....... H04J 3/065; H04J 3/0661; H03L 7/0814; G06F 1/12; H04L 7/0037; H04L 7/0033; H04L 7/0337
See application file for complete search history.

(56) References Cited

U.S. PATENT DOCUMENTS 6,104,228 A  8/2000 Lakshimikumar
6,574,225 B2 *  6/2003 Reynolds ........... H04N 21/4305
370/518
(Continued)

FOREIGN PATENT DOCUMENTS

EP  0424741 A2  5/1991

*Primary Examiner* — Aristocratis Fotakis
(74) *Attorney, Agent, or Firm* — Potomac Law Group, PLLC; Vincent M DeLuca

(57) ABSTRACT

A circuit for estimating a time difference between a first signal and a second signal includes a first signal line for receiving the first signal; a delay unit configured to receive the second signal and delay the second signal so as to provide a plurality of delayed versions of the second signal, each delayed version being delayed by a different amount of delay to the other delayed versions; a comparison unit configured to compare each of the delayed versions of the second signal with the first signal so as to identify which of the delayed versions of the second signal is the closest temporally matching signal to the first signal; and a difference estimator configured to estimate the time difference between the first and second signals in dependence on the identified delayed version.

18 Claims, 12 Drawing Sheets

(52) U.S. Cl.
CPC .......... *H04L 7/0037* (2013.01); *H04L 7/0041* (2013.01); *H04L 7/0079* (2013.01); *H04L 7/0337* (2013.01)

(56) References Cited

U.S. PATENT DOCUMENTS

| | | | |
|---|---|---|---|
| 7,098,706 B1* | 8/2006 | Pasqualini | G06F 1/12 |
| | | | 327/141 |
| 2004/0114469 A1* | 6/2004 | Duffner | G04F 10/00 |
| | | | 368/113 |
| 2005/0200393 A1 | 9/2005 | Furtner | |
| 2006/0140222 A1 | 6/2006 | Wolf et al. | |
| 2008/0080563 A1 | 4/2008 | Kataria et al. | |
| 2009/0128322 A1 | 5/2009 | Henzler et al. | |
| 2010/0123826 A1* | 5/2010 | Sagi | H04N 21/43637 |
| | | | 348/E7.001 |
| 2011/0228888 A1 | 9/2011 | Gelter et al. | |
| 2012/0169930 A1* | 7/2012 | Carter | H04N 21/43072 |
| | | | 348/E5.009 |
| 2014/0133613 A1 | 5/2014 | Kumar et al. | |
| 2014/0140459 A1* | 5/2014 | Greenspan | G06F 1/324 |
| | | | 375/371 |
| 2014/0184243 A1* | 7/2014 | Iyer | H03K 5/1534 |
| | | | 324/620 |
| 2016/0182621 A1 | 6/2016 | Errickson et al. | |

\* cited by examiner

SYNCHRONIZING DEVICES USING CLOCK SIGNAL DELAY COMPARISON

CROSS-REFERENCE TO RELATED APPLICATIONS AND CLAIM OF PRIORITY

This application is a continuation under 35 U.S.C. 120 of copending application Ser. No. 15/261,652 filed Sep. 9, 2016, which claims foreign priority under 35 U.S.C. 119 from United Kingdom Application No. 1515956.9 filed Sep. 9, 2015.

BACKGROUND OF THE INVENTION

This invention relates to synchronising devices.

Time synchronisation in computer and communication systems is important for performing time-sensitive tasks. A lack of synchronisation between devices can cause various issues. For example, in a wireless media system, a lack of synchronisation between different media playout devices (e.g. speakers) in the system may cause playback of the media to be out-of-sync. Other time-sensitive tasks where accurate synchronisation is critical include synchronising times for communicating (e.g. in time division multiple access communication systems), accurate time-stamping (e.g. for high-frequency trading), timing for global navigation satellite systems, etc.

A lack of synchronisation between devices may be caused by slight differences between clocks running at those devices. Even when clocks are initially set accurately, they will differ after some amount of time due to clock drift, which may be caused by, for example, the clocks counting time at slightly different rates, environmental factors such as temperature differences, relativistic effects, etc. Current methods of synchronising multiple devices involve using software to continuously monitor the time difference between the clocks of those devices and then updating a clock source (e.g. a phase lock loop). Such continuous monitoring requires a processor to be constantly powered on, which drains power.

Furthermore, updating certain clock sources, such as phase locked loops, also requires some additional time for the clock to stabilise. There is, therefore, a need for improved ways of synchronising devices.

SUMMARY OF THE INVENTION

According to a first aspect there is provided a circuit for estimating a time difference between a first signal and a second signal, the circuit comprising: a first signal line for receiving the first signal; a delay unit configured to receive the second signal and delay the second signal so as to provide a plurality of delayed versions of the second signal, each delayed version being delayed by a different amount of delay to the other delayed versions; a comparison unit configured to compare each of the delayed versions of the second signal with the first signal so as to identify which of the delayed versions of the second signal is the closest temporally matching signal to the first signal; and a difference estimator configured to estimate the time difference between the first and second signals in dependence on the identified delayed version.

The estimated time difference between the first and second signals may be the amount of delay that the closest matching delayed signal is delayed by.

The delay unit may comprise a series of delay signal lines, each delay signal line being coupled to the second signal line and configured to delay the second signal by a different amount of delay to the other delay signal lines so as to provide the plurality of delayed versions of the second signal.

The comparison unit may be configured to compare the signal at each of the delay signal lines with the first signal when the first signal transitions from a first state to a second state.

Each delay line may comprise a number of buffers, the number of buffers for each delay line being different to the number of buffers for the other delay lines, each buffer being configured to delay the second signal by a predetermined amount of time.

The delay unit may be configured to provide n delayed versions of the second signal, wherein the delay for the $i^{th}$ delayed version of the second signal is: delay(i)=iT, where i=1, 2, 3 . . . n and T is a predetermined amount of time.

The circuit may further comprise: a second signal line for receiving the second signal; a second delay unit configured to receive the first signal and delay the first signal by a plurality of delays so as to provide a plurality of delayed versions of the first signal, each delayed version of the first signal being delayed by a different amount of time to the other delayed versions; and a second comparison unit configured to compare each of the delayed versions of the first signal with the second signal, wherein the difference estimator is configured select the comparison unit or the second comparison unit for estimating the time difference between the first and second signals.

The first signal may be a time marker generated in dependence on a first clock and the second signal may be a time marker generated in dependence on a second clock.

The time difference may be less than a clock period of the first or second clock.

According to a second aspect there is provided a method of estimating a time difference between a first signal and a second signal, the method comprising: receiving the first signal at a first signal line; receiving the second signal and delaying the second signal so as to provide a plurality of delayed versions of the second signal, each delayed version being delayed by a different amount of delay to the other delayed versions; comparing each of the delayed versions of the second signal with the first signal so as to identify which of the delayed versions of the second signal is the closest temporally matching signal to the first signal; and estimating the time difference between the first and second signals in dependence on the identified delayed version.

The estimated time difference between the first and second signals may be the amount of delay that the closest matching delayed signal is delayed by.

The second signal may be delayed at a delay unit comprising a series of delay signal lines, each delay line being configured to delay the second signal by a different amount of delay to the other delay signal lines so as to provide the plurality of delayed versions of the second signal.

The comparing step may comprise comparing the signal at each of the delay signal lines with the first signal when the first signal transitions from a first state to a second state.

Each delay line may comprise a number of buffers, the number of buffers for each delay line being different to the number of buffers for the other delay lines, each buffer being configured to delay the second signal by a predetermined amount of time.

Said delaying may comprise providing n delayed versions of the second signal, wherein the delay for the $i^{th}$ delayed version of the second signal is: delay(i)=iT, where i=1, 2, 3 . . . n and T is a predetermined amount of time.

The method may further comprise: delaying the first signal by a plurality of delays so as to provide a plurality of delayed versions of the first signal, each delayed version of the first signal being delayed by a different amount of time to the other delayed versions; and comparing each of the delayed versions of the first signal with the second signal so as to identify which of the delayed versions of the first signal is the closest temporally matching signal to the first signal, estimating the time difference between the first and second signals in dependence on the identified delayed versions of the first or second signal.

The first signal may be a time marker generated in dependence on a first clock and the second signal is a time marker generated in dependence on a second clock.

The time difference may be less than a clock period of the first or second clock.

According to a third aspect there is provided computer program code defining the circuit described above, whereby the circuit can be manufactured.

According to a fourth aspect there is provided a non-transitory computer readable storage medium having stored thereon computer readable instructions that, when processed at a computer system for generating a manifestation of an integrated circuit, cause the computer system to generate a manifestation of the circuit described above.

According to a fifth aspect there is provided computer program code for performing the method described above.

According to a sixth aspect there is provided a non-transitory computer readable storage medium having stored thereon computer readable instructions that, when executed at a computer system, cause the computer system to perform the method described above.

DESCRIPTION OF THE DRAWINGS

The present invention will now be described by way of example with reference to the accompanying drawings. In the drawings.

DETAILED DESCRIPTION OF THE DRAWINGS

The following description is presented to enable any person skilled in the art to make and use the invention, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The present disclosure relates to synchronising devices. For example, one device may need to be synchronised with another device so that a specified event can occur at those devices at the same time. In another example, a component in a device may need to be synchronised with another component in the same device. Further still, each component at a device may need to be synchronised with a plurality of components at another device. The examples described herein relate to synchronising media devices so that the media can be played in-sync at each of the media devices. Other types of devices (e.g. computers, communications devices, positioning devices, etc) that perform other time-critical tasks may be synchronised in a similar way.

Figure 1:
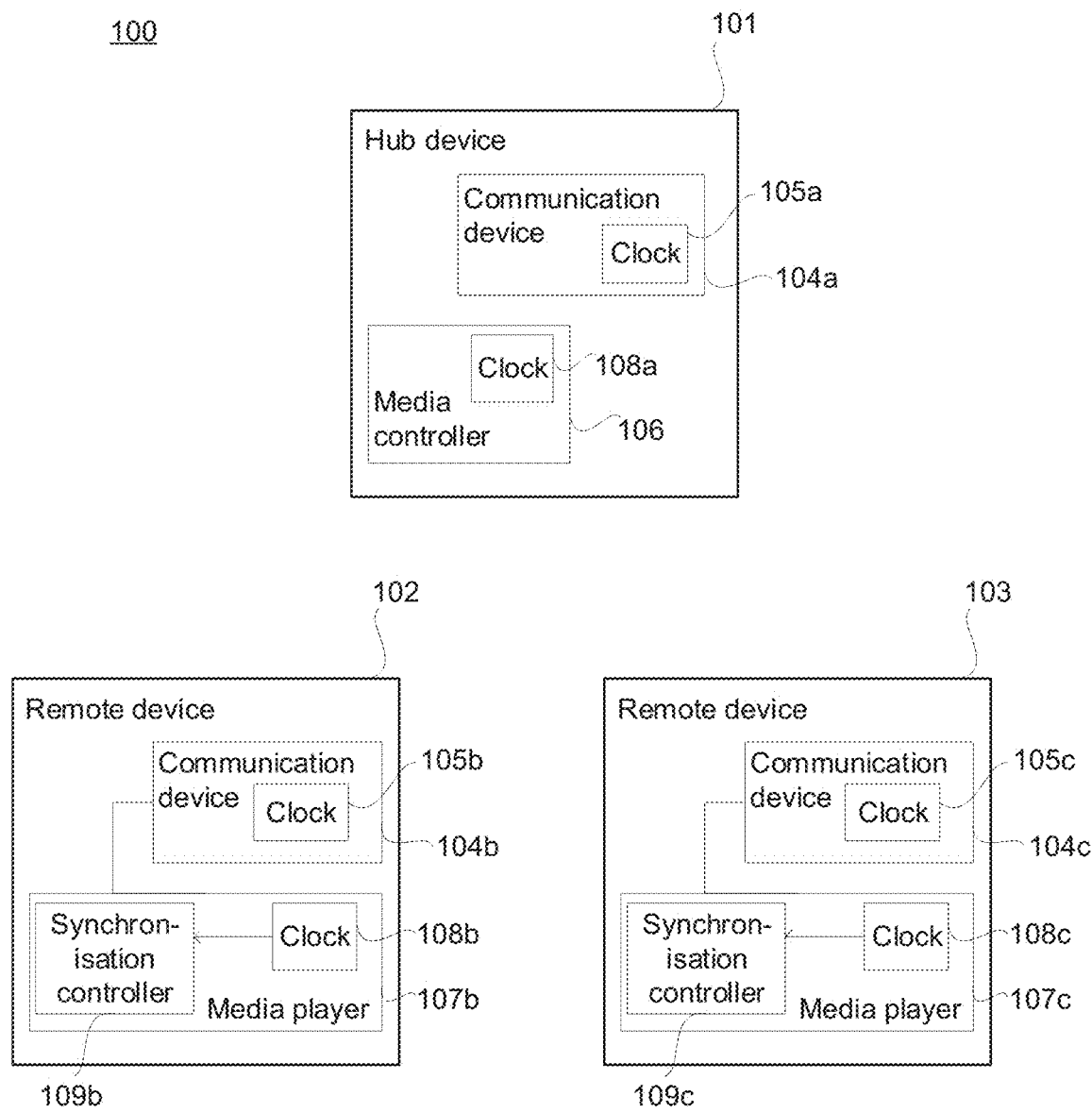
FIG. 1 shows an example system comprising a hub device and remote devices.

FIG. 1 depicts an example media system 100 comprising a hub device 101 and one or more remote devices 102 and 103. The hub device 101 comprises a media controller 106 for controlling the media that is to be outputted by the remote devices 102 and 103. The hub device 101 may be, for example, a smartphone, tablet, PC, laptop, smartwatch, smart glasses, speaker, smart TV, AV receiver, mixer, games console, games controller, media hub, set-top box, Hi-Fi, etc. The hub device 101 may comprise or be connected to a media source (not shown). The media source may be, for example, an internal storage device (e.g. flash memory, hard disk), a removable storage device (e.g. memory card, CD), a networked storage device (e.g. network drive or the cloud), an internet media provider (e.g. a streaming service), radio (e.g. DAB), a microphone, etc.

Each remote device 102 and 103 comprises (or is connected to) a media player 107b and 107c respectively for playing media. The hub 101 may be require media players 107b and 107c to playout media in-sync. Each of the media players 107b and 107c may provide media to a media output such as a speaker, display, vibration feedback motor, lights, etc. The hub device 101 may also comprise a media player and output (not shown) for playing media in-sync. Each media player 107b and 107c may be connected to a wireless communication device 104b and 104c respectively to receive media for playback or receive instructions to play out certain media. The media players 107b and 107c may also receive media from other media sources (not shown) connected to the devices 102 and 103 respectively. The remote devices 102 and 103 may be, for example, stand-alone speakers or displays or integrated into other devices such as smartphones, TVs, docking stations, Hi-Fis, smart watches, smart glasses, virtual reality headsets, etc.

Each device 101 to 103 may comprise a communications device 104a to 104c respectively for communicating with each other. Each communications devices 104a to 104c may comprise a clock 105a to 105c respectively to provide timing for that communication device. Each communications device 104a-c may use its clock to, for example, coordinate communications between the devices (e.g. coordinate times for receiving and sending data). In this example, communications devices 104a-c are devices that communicate according to a Wi-Fi protocol. However, the communications devices 104a-c could be any other suitable type of wired or wireless communications device such as Bluetooth, Ethernet, USB, Zigbee, LTE, I²S, S/PDIF, etc.

In the Wi-Fi example, clocks 105a-c may be physical layer clocks that are used as a timing source for Wi-Fi communications. The Wi-Fi standard provides for a timing beacon (time synchronisation function TSF) which is periodically broadcasted by the Access Point (AP) to each station (STA). The TSF is required to be processed by a receiver, which resets its own clock according to the TSF. Thus, the physical layer clocks 105a-c can be synchronised using the TSF. In the example of FIG. 1, either one of the hub device 101 or the remote devices 102 or 103 may be the AP.

Each device 101 to 103 may comprise a clock that provides timing for playing media. In the FIG. 1 example, media controller 106 comprises clock 108a and media players 107b and 107c comprise clocks 108b and 108c respectively.

Figure 3:
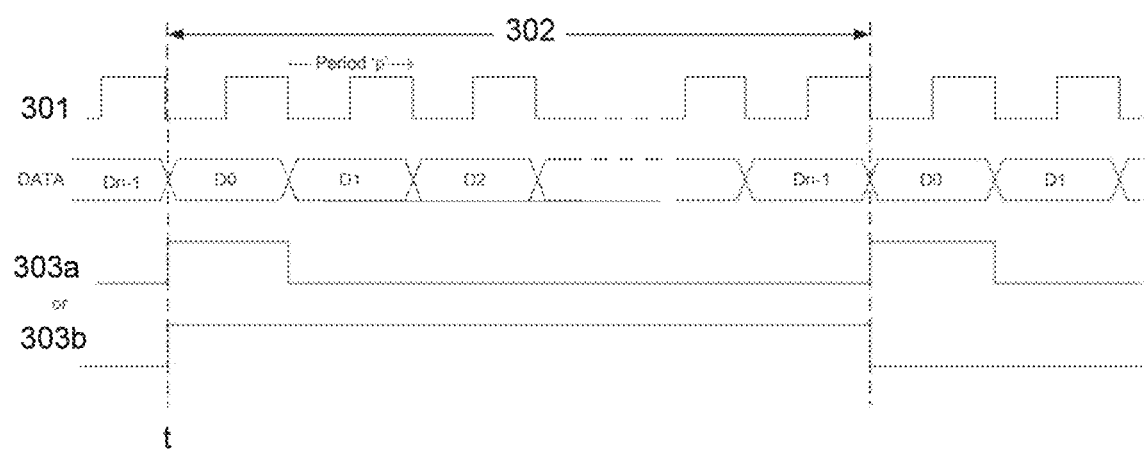
FIG. 3 illustrates examples of time markers.

Each of the clocks mentioned above (Wi-Fi clocks 105a-c and media clocks 108a-c) may generate a clock signal at a clock frequency f, which may be tuneable. Each clock may operate at the same or different clock frequencies. Each clock may change its value from a first value (e.g. 0) to a second value (e.g. 1) and back to the first value every clock period p. The clock period p=1/f. An example clock signal 301 is depicted in FIG. 3. Each clock may be tuned using a PLL (not shown), which may be controllable by suitable control software.

In an example scenario, the media controller 106 at the hub device 101 may instruct (e.g. via Wi-Fi) each of the remote devices 102 and 103 to perform a time-sensitive task. For example, the time-sensitive task may be playing media in sync at each remote device 102 and 103. This may comprise either playing back the same media from each of the remote devices 102 and 103 in sync (e.g. for multi-room playback) or playing different components of the media in sync (such as left and right stereo channels). Synchronised playback of the media relies on the media players 107b and 107c to be synchronised in time with each other. Clock drift, however, between clocks 108b and 108c may cause the media players 107b and 107c to lose synchronisation over time and thus cause the media to be played back out-of-sync.

Each media controller 107b and 107c comprises a synchronisation controller 109b and 109c for providing a synchronised clock signal from clock 108b and 108c respectively.

In a first scenario, each synchronisation controller 109b and 109c may provide a clock signal that is synchronised with a common (or reference) clock. In this example, the reference clock may be Wi-Fi clock 105a of the hub device 101. As mentioned above, clocks 105b and 105c are synchronised with clock 105a via the TSF. Thus, synchronisation of the media clocks 108b and 108c with the TSF-synchronised Wi-Fi clocks 105b and 105c respectively will cause the media clocks 108b and 108c to be synchronised with each other. Therefore, in this example, synchronisation is achieved by controller 109b providing a clock signal that is synchronised with Wi-Fi clock 105b and controller 109c providing a clock signal that synchronised with Wi-Fi clock 105c. Alternatively, the received TSF may be provided directly to each controller 109b and 109c to provide a timing reference for synchronising the clock signals.

In a second scenario, only one of the controllers 109b or 109c performs synchronisation. For example, controller 109b may provide a clock signal that is directly synchronised with media controller 107c. This may be achieved by device 103 directly and periodically sending a timing message (such as ping) to device 102 via, e.g., communications devices 104b and 104c. Controller 109b may then provide a clock signal that is synchronised according to the received timing message.

The synchronisation process that is carried out by one or both controllers 109b and 109c is described in further detail below. For simplicity, the following discussion refers to synchronisation performed by controller 109b only. This may be synchronisation performed in the first or second scenario mentioned above or any other scenario which may require device 102 to be synchronised with another device.

Figure 2:
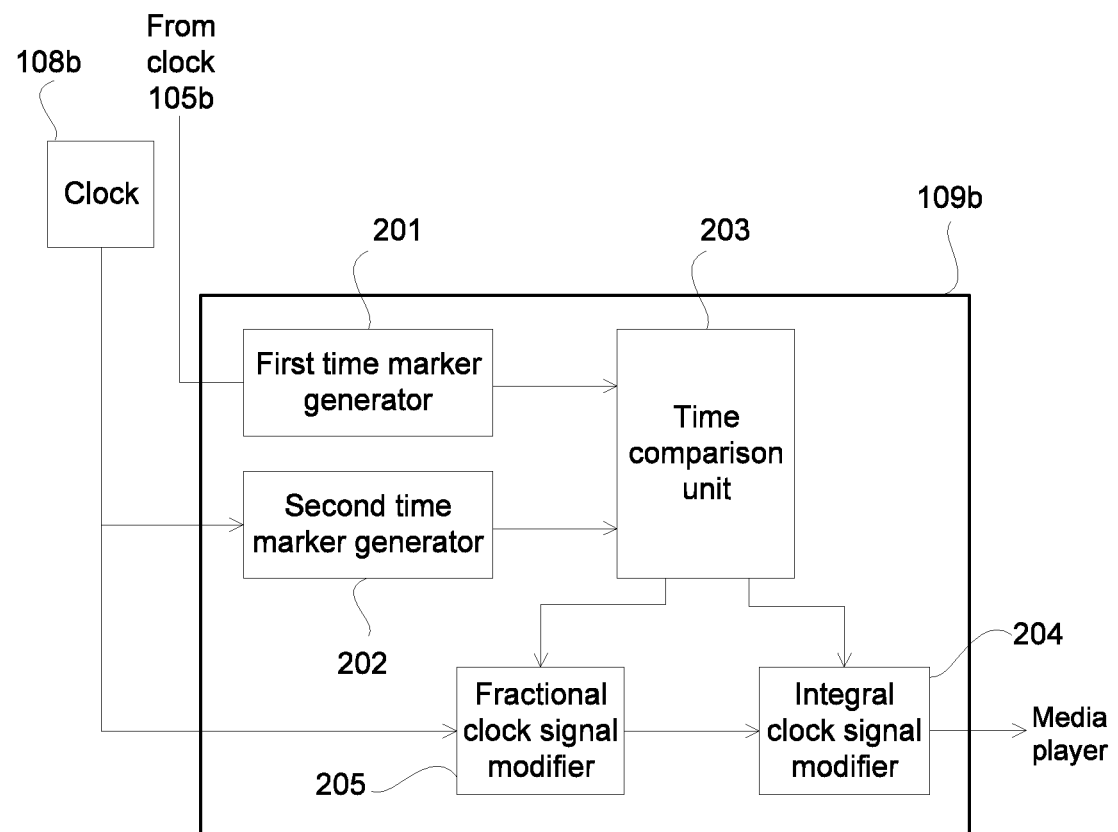
FIG. 2 shows an example schematic for a controller.

FIG. 2 is an example schematic for synchronisation controller 109b. The controller 109b may comprise a first time marker generator 201, a second time marker generator 202, time comparison unit 203, an integral clock signal modifier 204 and a fractional clock signal modifier 205. Each component 201 to 205 of the controller 109b has a particular function (as described further below) that can be carried out independently of the other components.

The controller 109b provides a synchronised clock signal to the media player 107b that is synchronised with clock 105b. Controller 109b may receive a clock signal from clock 108b and modify that signal via the integral clock signal modifier 204 and/or the fractional clock signal modifier 205 to provide a modified clock signal that is synchronised with clock 105b. Thus, rather than re-tuning clock 108b, the signal outputted by the clock 108b is modified so that it is synchronised with clock 105b. The modified clock signal is provided to the media player 107b, which uses it for timing. Alternatively, the controller 109b may be used to determine the time difference between clocks 105b and 108b and then adjust clock 108b (e.g. by tuning the clock PLL) to synchronise it with clock 105b. In this implementation, the clock signal from clock 108b is provided to the media player 107b rather than a modified version of the clock signal.

Below is a detailed description of each of the components of controller 109b. As mentioned above, each of the components may operate independently of the other components and may be individually provided in other implementations. For example, the time comparison unit 203 may be provided in any other suitable device that requires the time difference between two signals (of any suitable type) to be determined. In another example, the fractional clock signal modifier 205 may be provided in any other suitable device that requires a signal (of any suitable type) to be temporally shifted.

Time Marker Generators

The first and second time marker generators 201 and 202 generate signals (such as time markers) that represent a time on the clocks that are to be synchronised. For example, it may be that clock 108b is to be synchronised with clock 105b (e.g. as in the first scenario described above). In this case, a signal representing time at clock 105b is provided to one of the time maker generators (e.g. generator 201) and a signal representing time at clock 108b is provided to the other time marker generator (e.g. generator 202). The time marker generators 201 and 202 output time markers that represent the same time according to the respective clocks. Thus, if clocks 105b and 108b are in sync, the time markers outputted by the generators 201 and 202 would be the same. If clocks 105b and 108b are out-of-sync, then the time markers outputted by the generators 201 and 202 would be offset by the time difference that the clocks 105b and 108b are out-of-sync by. The signals from the generators 201 and 202 are provided to time comparison unit 203 to determine the difference in time between the signals.

The signal provided to the generators 201 and 202 may the clock signals that are outputted by each of the clocks 105b and 108b. The generators 201 and 202 may receive the clock signals and output a time marker that indicates that same particular time according to both clocks. As shown in FIG. 3, the type of time marker output by each generator 201 and 202 may, for example, be a pulse 303a that is generated at a particular time t or a signal 303b whose polarity changes at time t. The generators 201 and 202 may output time marker signals that change after a particular amount of time has passed according to each of the clocks 105b and 108b. For example, the generators 201 and 202 may output a signal that pulses or changes in polarity every y seconds (e.g. 20 microseconds) according to that clock.

In another example, the time at a clock may be obtained indirectly via operations or tasks or events that are synchronised with that clock. As shown in the example of FIG. 3, the time markers may be generated in dependence on when a media frame 302 is played out. Media frame 302 may be required to be played out at a set time t according to clock 108b. When the clock 108b ticks to time t, the media frame 302 begins to play out. Thus, the instant that the media frame 302 begins to play out may be indicative of time t according to media clock 108b. A time marker 303a or 303b may be generated at the start of frame 302 and that time marker will indicate time t according to the clock 108b. This example is depicted in FIG. 3, which shows a media frame 302 (that has n−1 data bits in a frame) that is due to played out at time t. In this example, the second time marker generator 202 receives, as its input, an indication of when frame 302 is due to be played out from the media player 107b instead of the clock signal from media clock 108b. The second time marker generator 202 may output a time marker signal 303a or 303b which changes at the start of each frame. The time marker signal generated is provided to time comparison unit 203. In this example, the first time marker generator 201 generates a time maker at time t according to WiFi clock 105b. For example, the first time marker generator 201 receives the clock signal from WiFi clock 105b and when that clock ticks to time t, the generator 201 outputs a time marker signal 303a or 303b.

In another example, the first time marker generator 201 may generate a time marker in dependence on a signal received by the communication device 104b. For example, communication device 104b may be a Wi-Fi device which periodically receives a timing beacon (TSF) from an access point (AP). The beacon may comprise a timestamp of the time (according to a clock at the AP) that the beacon is generated and transmitted by the AP. The beacon is required to be processed by a receiver as a priority and, as it is broadcast by the AP, there is a fast and direct path between the access point and each receiver. Thus, receiving the beacon provides an accurate indication of the time at the clock of the access point simultaneously to each receiving device (e.g. devices 102 and 103). In an example, the AP clock is clock 105a at hub 101. The first time marker generator 201 may be provided with the beacon as soon as it is received by communication device 104b of remote device 102. Alternatively, an indication that the beacon has been received may be provided to the first time marker generator 201. The first time marker generator 201 then outputs a time maker as soon as it receives the beacon (or the indication). The generated time maker (from generator 201) provides an indication of the timestamp time according to clock 105a of the hub device 101. The second time marker generator 202 may also be provided with the received beacon (or the timestamp information in the received beacon). The second time marker generator 202 then generates a time maker when clock 108b ticks to the timestamp time. Thus, the time marker generated at generator 202 is indicative of the timestamp time according to clock 108b. The generated time markers are provided to time comparison unit 203 to compare the time difference between the two markers.

In the above example, an adjusted value of the timestamp may be used to generate the time marker at time marker generator 202. For example, the received timestamp value may be adjusted by adding an amount of time equal to the delay between receiving the beacon at the medium/physical interface of the communication device 104b and receiving the beacon (or the indication that the beacon has been received) at time marker generator 201. Thus, the second time marker generator 202 generates a time marker when clock 108b ticks to the timestamp time plus a delay for receiving the beacon (or its indication) at time marker generator 201.

Alternatively, the Wi-Fi device 104b may generate the time marker in dependence on the received beacon and provides the time marker directly to the comparison unit 203 instead of the first time marker generator 201.

The time markers provide a simple representation of time according to various devices. This allows comparison of time to be quick and simple and it is capable of being carried out at fast and efficient hardware devices such as logic gates. The time markers can also be used to check if events are triggered at the same time/rate in time-sensitive systems.

Time Comparison Unit

Time comparison unit 203 compares the signals (i.e. the time markers) received from the time marker generators 201 and 202 to determine the difference in time between the two signals. The time comparison unit 203 determines if the difference in time between the two signals is greater than or equal to one clock period of clock 108b or less than one clock period of clock 108b. Based on this determination, an appropriate technique for modifying the clock signal from clock 108b is selected. If the difference is less than one clock period, then the fractional clock signal modifier 205 is selected to perform modification of the clock signal. If the difference is greater than one or equal to one clock period, then the integral clock signal modifier 204 solely or in combination with modifier 205 is selected to perform modification of the clock signal. In another example, the time comparison unit 203 may select the fractional clock signal modifier 205 only to perform modification if the difference is greater than one clock period. The operation of modifiers 204 and 205 is discussed in detail further below.

Figure 4A:
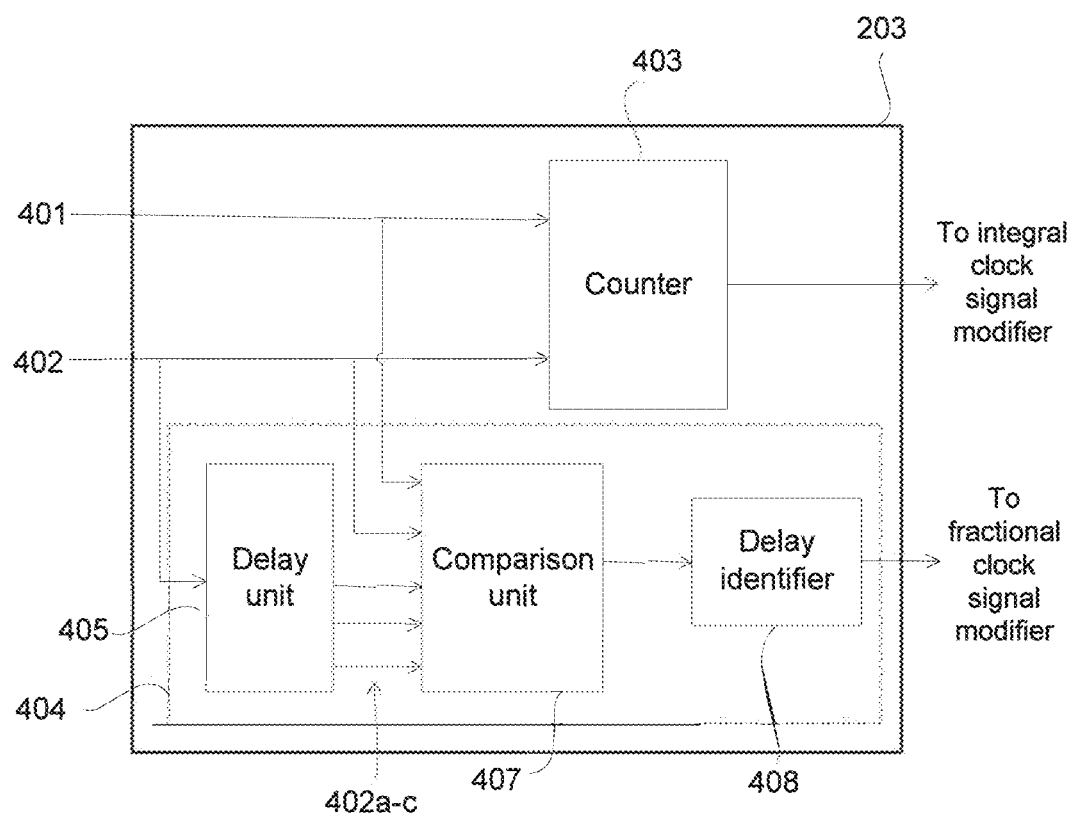
FIG. 4a shows an example schematic for a time comparison unit.
Figure 4B:
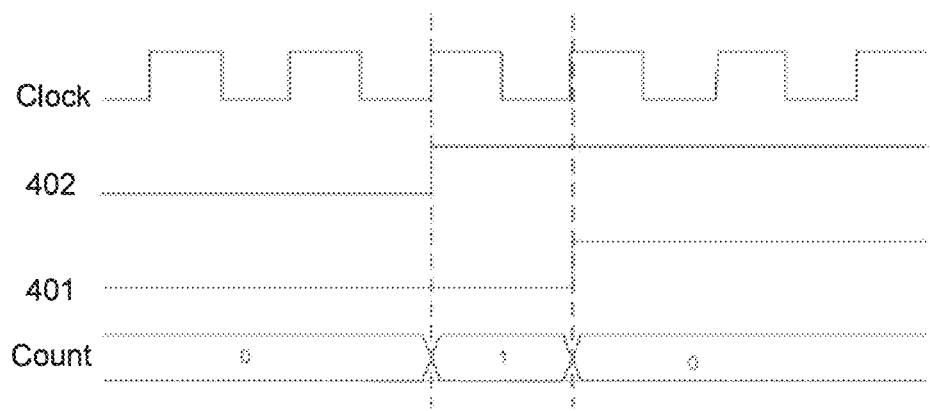
FIG. 4b illustrates an example for determining the time difference between two time markers.

FIG. 4a is an example schematic for the time comparison unit 203. The time comparison unit receives time markers 401 and 402 generated by generators 201 and 202 respectively. The time comparison unit 203 comprises a counter 403 for counting the number of clock periods (of clock 108b) between the time markers 401 and 402. The counter starts counting the number of clock periods when the signal from a time marker changes and stops counting when the signal from the other time marker changes. FIG. 4b illustrates a scenario where the time difference between markers 401 and 402 is one clock period and so a count of one is measured by the counter 403. If the counter 403 measures a count of one or more, then it is determined that the difference in time between the markers 401 and 402 is greater than or equal to one clock period of clock 108b and that the clock signal from clock 108b is to be modified using the integral modifier 204.

Figure 4C:
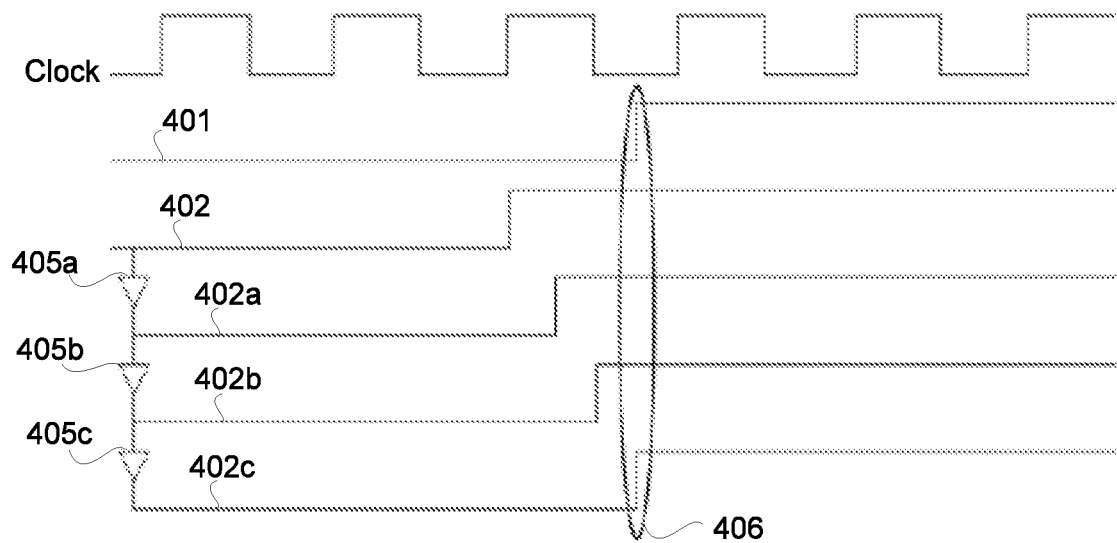
FIG. 4c illustrates another example for determining the time difference between two time markers.

The time comparison unit 203 comprises a fractional difference estimator 404 for determining time differences that are less than one clock period (i.e. a fraction of a clock period) between markers 401 and 402. FIG. 4c illustrates a scenario where the time difference between the time markers 401 and 402 is less than a clock period. The fractional difference estimator 404 comprises a delay unit 405 for delaying one of the time markers by different amounts to provide delayed versions of that time marker. In this example, time marker 402 (which represents a time on media clock 108b) is delayed. The delay unit 405 may comprise a plurality of delay buffers for delaying the inputted time marker. This is illustrated in FIG. 4c, which shows delay buffers 405a, 405b and 405c delaying timing marker 402 to provide delayed versions 402a, 402b, 402c of time marker signal 402. Each of the delayed versions is then compared against the other time marker 401 to determine which delayed version 402a, 402b or 402c is the closest matching (in time) to time marker 401, as illustrated by 406 in FIG. 4c. In the FIG. 4c example, delayed version 402c is the closest matching delayed version to time marker 401. The fractional difference estimator 404 may comprise a comparison unit 407 for comparing each of the delayed versions of marker 401 with the other marker 402.

The amount of delay applied (sum of 405a, 405b and 405c) to the closest matching delayed signal (402c) corresponds to the time difference between the markers 401 and 402. Each of the delay buffers 405a-c may apply a delay of, for example, 3 ns. Signal 402 passes through all three delay buffers 405a, 405b and 405c to provide delayed version 401c. Thus, the total delay applied to version 401c is 9 ns and so the time difference between markers 401 and 402 is estimated to be 9 ns.

The delay unit 405 delays the time marker by n number of delays, wherein each of the delays is different. Preferably, the time marker is delayed in increments of a predetermined amount of time (e.g. 2 ns, 3 ns or 4 ns, etc) to provide delayed versions that are increasingly delayed. For example, the delay unit 405 may provide n delayed versions of a time marker signal, wherein the delay for the $i^{th}$ delayed version is:

$$\text{delay}(i)=iT, \text{ where } i=1, 2, 3 \ldots n \text{ and } T \text{ is the predetermined amount of time.}$$

As described above in relation to FIG. 4c, the delay unit 405 may comprise a series of delay buffers for delaying the time marker signal. The output of each delay buffer in the series may be provided to the input of the next buffer in the series. A signal line may be connected to the output of each buffer to provide each delayed version of the time marker signal to the comparison unit 407.

The comparison unit 407 receives time marker 401, time marker 402 and each of the delayed versions 402a-c its input. The comparison unit 407 compares time marker 401 with time marker 402 and each of the delayed versions 402a-c. In this example, the signals are compared by determining when the rising edge of each of the delayed version 401a-c occurs and determining which of those determined times is the closest to the time of when the rising edge of the time marker signal 401 occurs.

If the time marker signal is a pulse signal (e.g. such as 303a, as described above in reference to FIG. 3) then the comparison unit 407 may capture the data from each of the signal lines for the delayed versions 402a-c at the instant that signal 401 transitions from one state to another (e.g. when the rising edge of signal 401 is detected). If the time marker signal is a level signal (303b), then the comparison unit 407 may capture the data from the signal lines for delayed versions 402a-c at the instant that a rising edge or falling edge of signal 401 is detected. Thus, the comparison unit 407 may be enabled only when a rising edge (and falling edge for level time markers) from signal 401 is detected. This saves on power requirements compared to continuously monitoring the drift between clocks or conventional overclocking methods.

Figure 5:
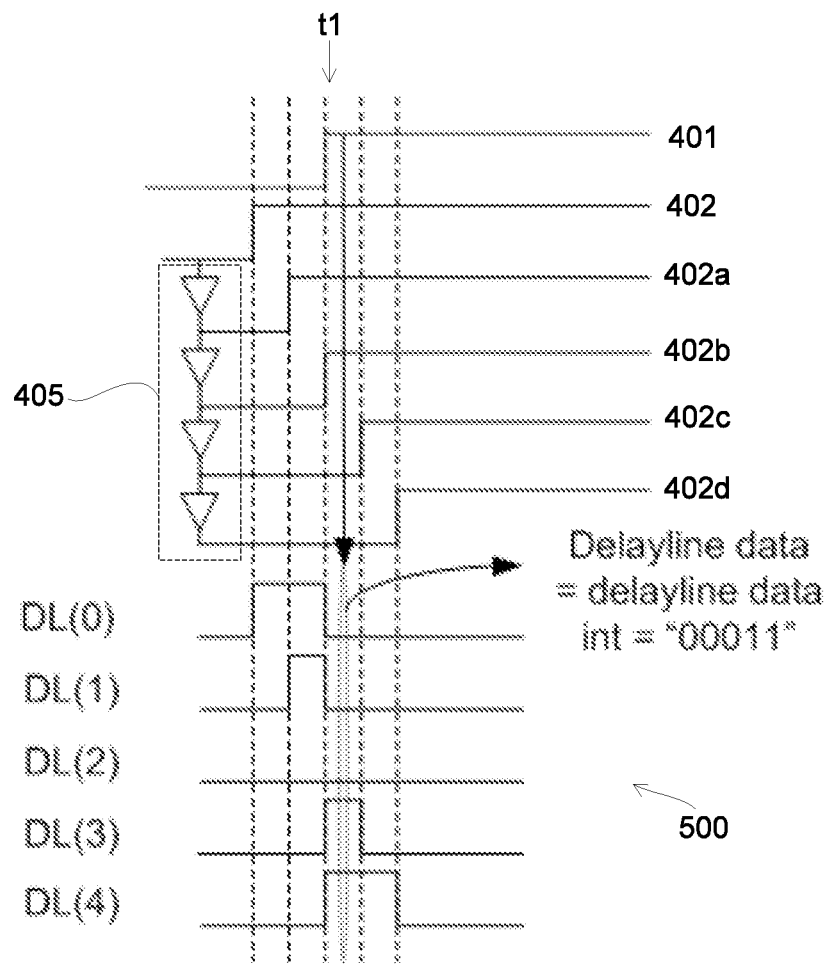
FIG. 5 illustrates an example of comparing time markers.

FIG. 5a describes one example of how the comparison unit 407 compares a time marker 401 with time marker 402 and delayed versions 402a-d of time marker 402. In this example, delayed version 402b is the closest matching signal to 401 (rather than 402c in the previous example). In this example, the delay unit 405 provide signals 402a-d, which are incrementally delayed. The first delay line in the series applies a delay of T to provide signal 402a, the second delay line applies a delay of 2T to provide signal 402b, the third delay line applies a delay of 3T to provide signal 402c, and so on. An exclusive-OR (XOR) operation may be performed on signal 401 and signal 402 and each delayed version 402a-d. The result of the XOR operation is shown generally at 500. The result of the XOR operation may be captured when a rising edge of signal 401 is detected at time t1. As shown in FIG. 5, signal 402 is ahead (in time) of signal 401. Thus, when signal 401 transitions to a different state (e.g. a higher state, as shown in the figure), signal 402 is already at that state. When signal 401 and 402 are XOR'd at time t1, the result is "0" as shown at DL(0). XOR of delayed signal 402a (shown at DL(1)) also produces a result of "0" at time t1 because it is still ahead of signal 401. The delay applied to signal 402b causes it to be similar to signal 401. Signal 402b also produces an XOR result of "0" (as shown at DL(2)) because the XOR inputs are the same. The delays applied to delayed signals 402c and 401d cause those signals to be delayed such that they are behind (in time) signal 401. This causes their XOR results (shown at DL(3) and DL(4) respectively) at time t1 to be "1". Thus the captured XOR results at t1 is "00011" (in increasing delay order).

The fractional difference estimator 404 may comprise a delay identifier 408 for estimating the delay between time markers 401 and 402 based on the XOR results provided by the comparison unit 407. The transition from "0" to "1" in the captured result identifies which of the signals 402-402d is the closest matching to signal 401. The delay line corresponding to the "0" value immediately prior to the first "1" value (i.e. the most delayed "0" delay line) at time t1 corresponds to the delay line with the closest matching signal. The amount of delay applied by each delay line is known and so the delay identifier 408 estimates the time difference between time markers 401 and 402 by determining the amount of delay applied to the closest matching delayed version of time marker 402. This time difference indicates the amount of time that clocks 105b and 108b are out-of-sync by. The delay identifier 408 provides the fractional clock signal modifier 205 with the identified time difference.

Figure 6:
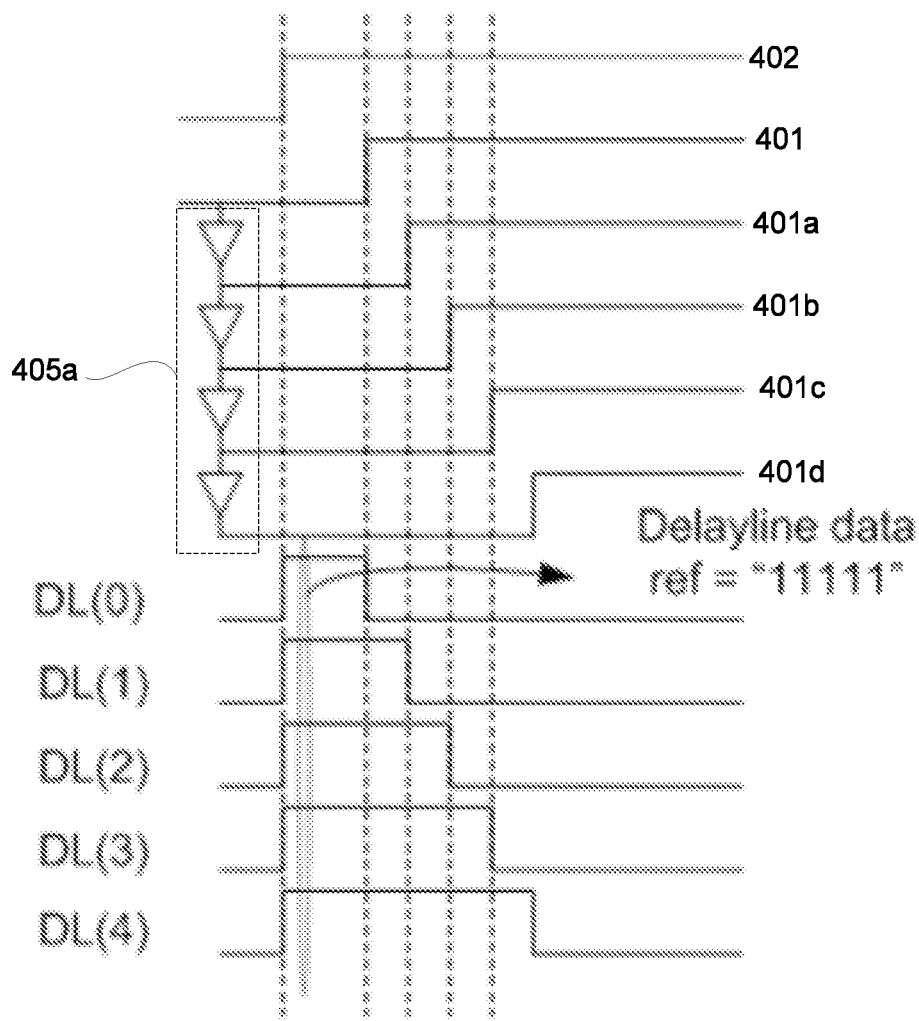
FIG. 6 illustrates another example of comparing time markers.

In the above example, time marker 402 is ahead of time marker 401 (because clock 108b is faster than clock 105b) and so it is possible to provide delayed versions of time maker 402 for comparison with time marker 401. In a scenario where time marker 401 is ahead of time marker 402 (because clock 105b is faster than clock 108b), XOR'ing the delayed versions 401a-d of time marker 401 with time marker 402 will result in a series of "1"s, as illustrated in FIG. 6, and so it will not be possible to determine the time difference between the markers 401 and 402. Thus, as shown in FIG. 6, a second delay unit 405a may be provided that comprises a second series of delay buffers for providing delayed versions 401a-d of time marker 401. A second comparison unit (not shown) may also be provided for comparing time marker 402 with each of the delayed versions 401a-d to determine which of the delayed versions 401a-d is the closest matching (in time) to time marker 402. The second comparison unit may operate in a similar manner to comparison unit 407 described above. The outputs from both comparison units may be provided to the delay identifier 408 to determine: 1) which time maker 401 or 402 is faster; and 2) from the output of the delayed versions of the faster time marker, the time difference between the time markers 401 and 402. For example, using the examples in FIGS. 5 and 6, the difference estimator 408 may be provided with an output of "00011" from comparison unit 407 and an output of "11111" from the second comparison unit. As there is a transition from "0" to "1" in the output from comparison unit 407 and no transition from "0" to "1" in the output from the second comparison unit, it is determined that time marker 402 is faster than time marker 401. The output from comparison unit 407 is then used to determine the time difference between time markers 401 and 402 as described above.

The time comparison unit 203 outputs the result from: (i) counter 403 if the time difference between markers 401 and 402 is equal to or greater than one clock period; or (ii) the result from the fractional difference estimator 404 if the time difference is less than one clock period. The output from the counter 403 is provided to the integral clock signal modifier 204 the output from the fractional difference estimator 404 is provided to the fractional clock signal modifier 205. Alternatively, the time difference determined by counter 403 or estimator 404 may be provided to a clock controller (such as a PLL tuner, not shown), which may update clock 108b based on the determined difference.

Figure 4D:
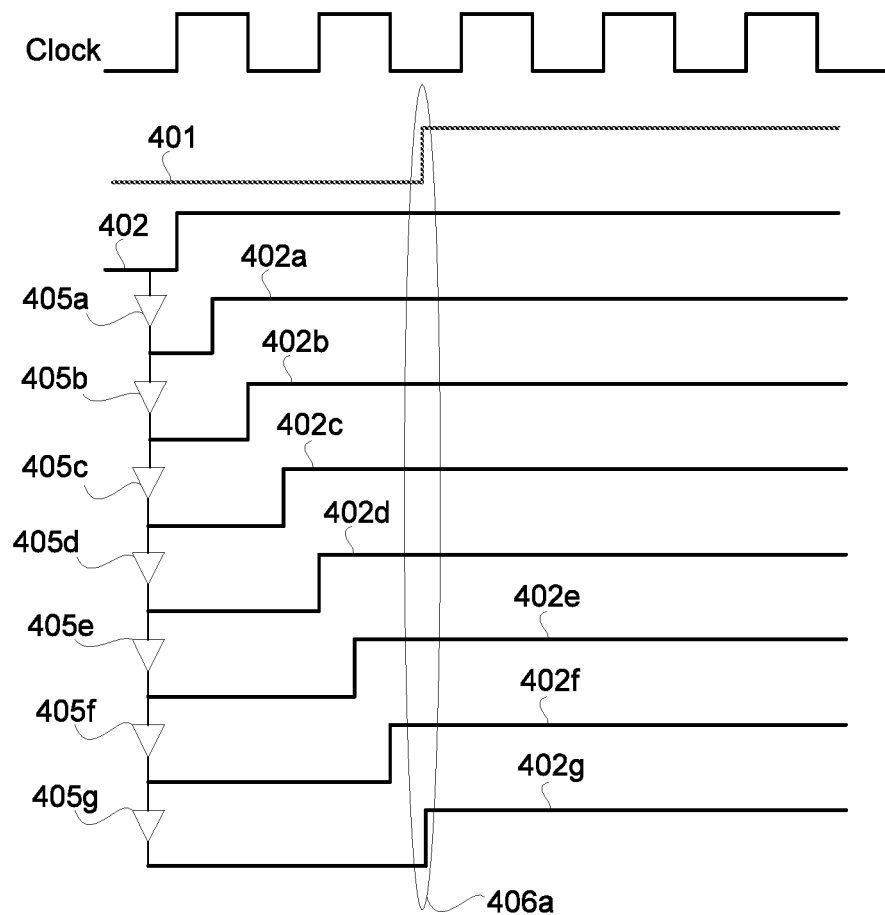
FIG. 4d illustrates yet another example for determining the time difference between two time markers.

In an alternative implementation, the fractional difference estimator 404 may identify delays that are greater than one clock period. This may be achieved by providing enough delay buffers so that delays of greater than one clock period can be applied to provide delayed versions of the time marker 402 that are greater than one clock period. This is illustrated in FIG. 4d, which shows additional buffers 405d-405g for providing delayed versions 402d-402g respectively of time marker 402. Similarly to FIG. 4c, each of the delayed versions is then compared against time marker 401 to determine which one of delayed versions 402a-g is the closest matching (in time) to time marker 401, as illustrated by 406a in FIG. 4d. Thus, in this example, the fractional difference estimator 404 identifies delayed version 402g as being the closest matching signal to time marker 401, which is delayed by about 1.7 clock periods.

Clock Modification

The clock signal provided to the media player 107b may be modified based on the time difference determined by the time comparison unit 203. In one example, the time difference determined by the time comparison unit 203 may be provided to a clock controller which is capable of adjusting the source of the clock signal (e.g. clock 108b). For example, if the clock source is a PLL clock generator, then the PLL can be controlled to re-tune the clock so that the determined time difference is eliminated, thus synchronising clock 108b with clock 105b. Re-tuning of the clock source is a relatively slow process as it takes some time for the clock source to stabilise to the new phase/frequency. Thus, it can be advantageous to modify the signal outputted by the clock source (rather than re-tuning the clock source) as the modification can be carried out relatively quickly. The modified clock signal may then be provided to the media player 107b.

Figure 7:
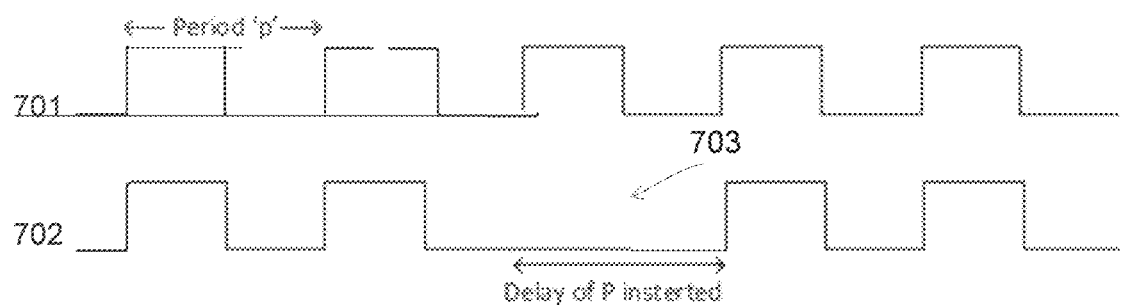
FIG. 7 illustrates an example of delaying a clock signal.

If the time difference determined by the time comparison unit 203 is such that clock 108b is ahead of clock 105b by one or more clock periods, counter 403 provides the time difference to the integral clock signal modifier 204. The integral clock signal modifier 204 receives the clock signal from clock 108b (directly or via the fractional clock signal modifier 205, as shown in FIG. 2) and modifies it by causing one or more clock pulses to be skipped. For example, if the time difference determined by counter 403 is that clock 108b is ahead of clock 105b by N clock periods, the modifier 204 would cause N clock pluses to be skipped. This has the effect of slowing down or delaying the clock signal by N clock periods. This is illustrated in FIG. 7, which shows the original clock signal 701 from clock 105b and the modified clock signal 702, which is modified by skipping one clock pulse at 703. The integral clock signal modifier 204 may cause N pulses to be skipped by gating the clock signal 701 for the N number of pulses that need to be removed. The modified signal 702, which is now synchronised, is provided to the media player 107b.

Figure 8:
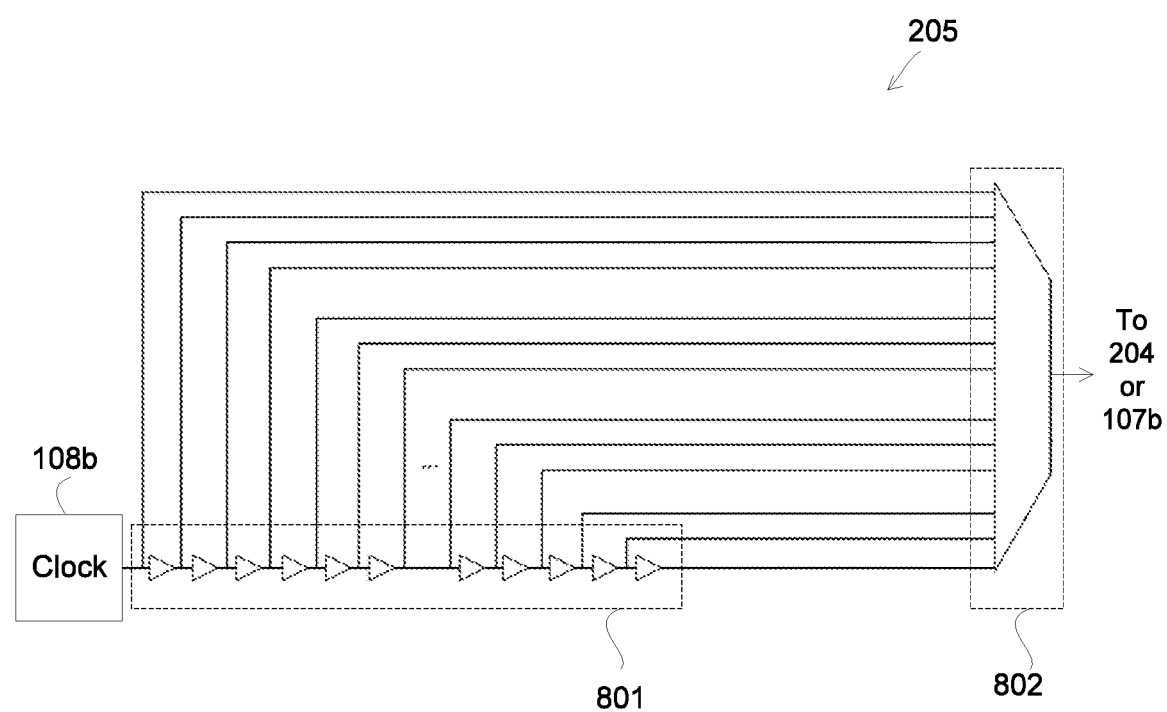
FIG. 8 shows an example circuit for a fractional clock signal modifier.

If the time difference determined by the time comparison unit 203 is such that clock 108b is ahead of clock 105b by less than one clock period, fractional difference estimator 404 provides the time difference to the fractional clock signal modifier 205. Fractional modifier 205 receives the clock signal from clock 108b and modifies it by causing the clock signal to be delayed by the determined time difference. FIG. 8 illustrates an example of fractional clock modifier 205, which comprises a delay unit 801 and a multiplexer unit 802. The delay unit 801 receives the clock signal 701 from clock 108b and delays the clock signal 701 by a plurality of delays to provide a plurality of delayed versions of the clock signal 701. The delay unit 801 comprises a series of delay buffers, which provides the plurality of delayed versions of the clock signal in a similar manner to delay unit 405 (described above). Each delayed version of the clock signal is provided to the multiplexer unit 802. The multiplexer unit 802 receives the fractional time difference from the fractional difference estimator 404 and selects the delayed version of the clock signal that is delayed by an amount of time that corresponds to the fractional time difference. The selected delayed version is provided to the integral clock signal modifier 204 for further modification or to the media player 107b to provide a synchronised clock signal.

Figure 9:
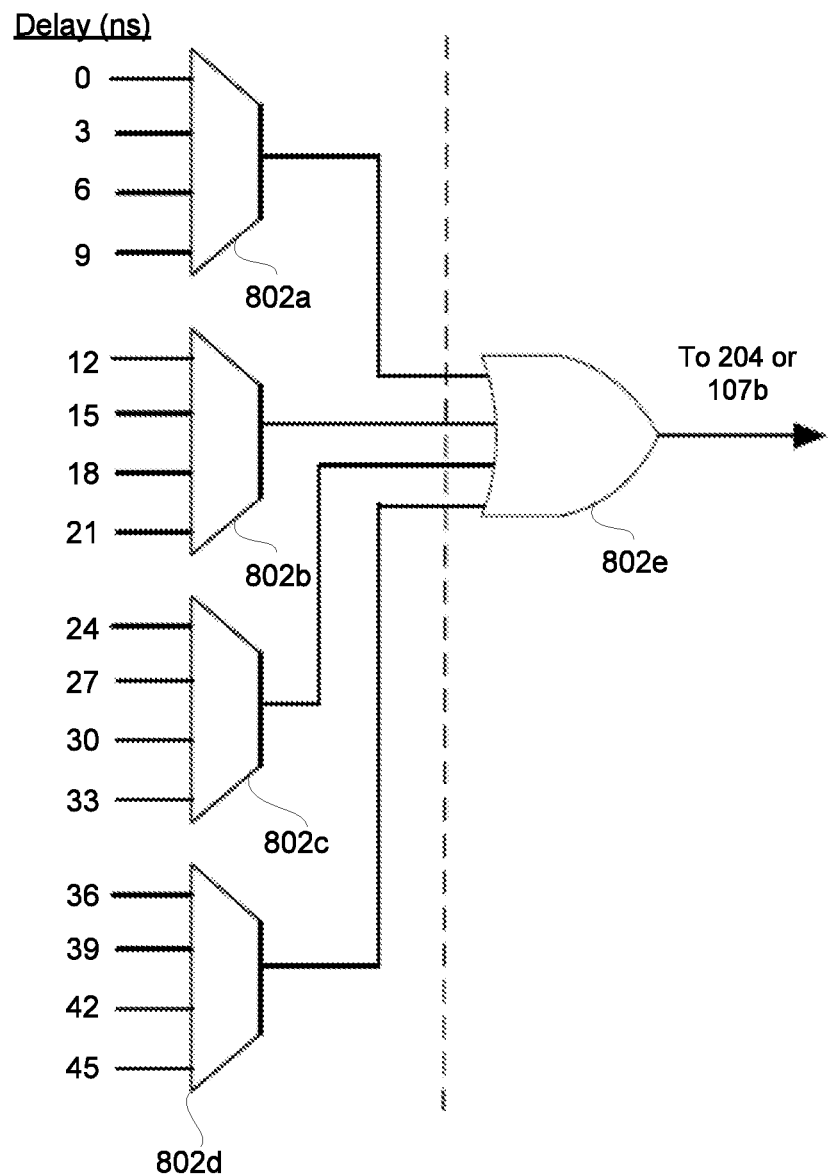
FIG. 9 shows an example circuit for a multiplexer unit.

Preferably when modifying a clock signal using the fractional clock signal modifier 205, switching between different delayed versions of the clock signal is performed incrementally. This helps to keep the media player 107b and controller 109b stable. FIG. 9 illustrates an example for incrementally modifying clock signal 701. In this example, the delay unit has 15 delay lines, each incrementally delaying the clock signal 701 by 3 ns each (so providing a delay of 45 ns at the 15th delay line). The multiplexer unit 802 in this example comprises four 4:1 multiplexers 802a-d in a cascaded architecture. Multiplexer 802a is provided with the original clock signal 701 (zero delay) and the first three delayed versions of signal 701 (i.e. delayed by 3, 6 and 9 ns) from the delay unit 801, multiplexer 803b is provided with the subsequent four delayed versions (i.e. delayed by 12, 15, 18 and 21 ns), and so on. An OR gate 802e is provided, which receives the output from multiplexers 802a-d and outputs a signal corresponding to selected delay line. If, for example, the time difference determined by the fractional difference estimator 404 is 36 ns, the multiplexers 802a-d are set so that the delay is incrementally increased to 36 ns over a number of clock cycles. For example, the multiplexers could be set to increase the delay by switching from: (i)

signal 701 (with zero delay) to 9 ns delay; (ii) 9 ns delay to 18 ns delay; (iii) 18 ns delay to 27 ns delay; and (iv) 27 ns delay to 36 ns delay. Each increment may be carried out after a predetermined number of clock cycles (e.g. every four cycles) to aid stability.

Figure 10:
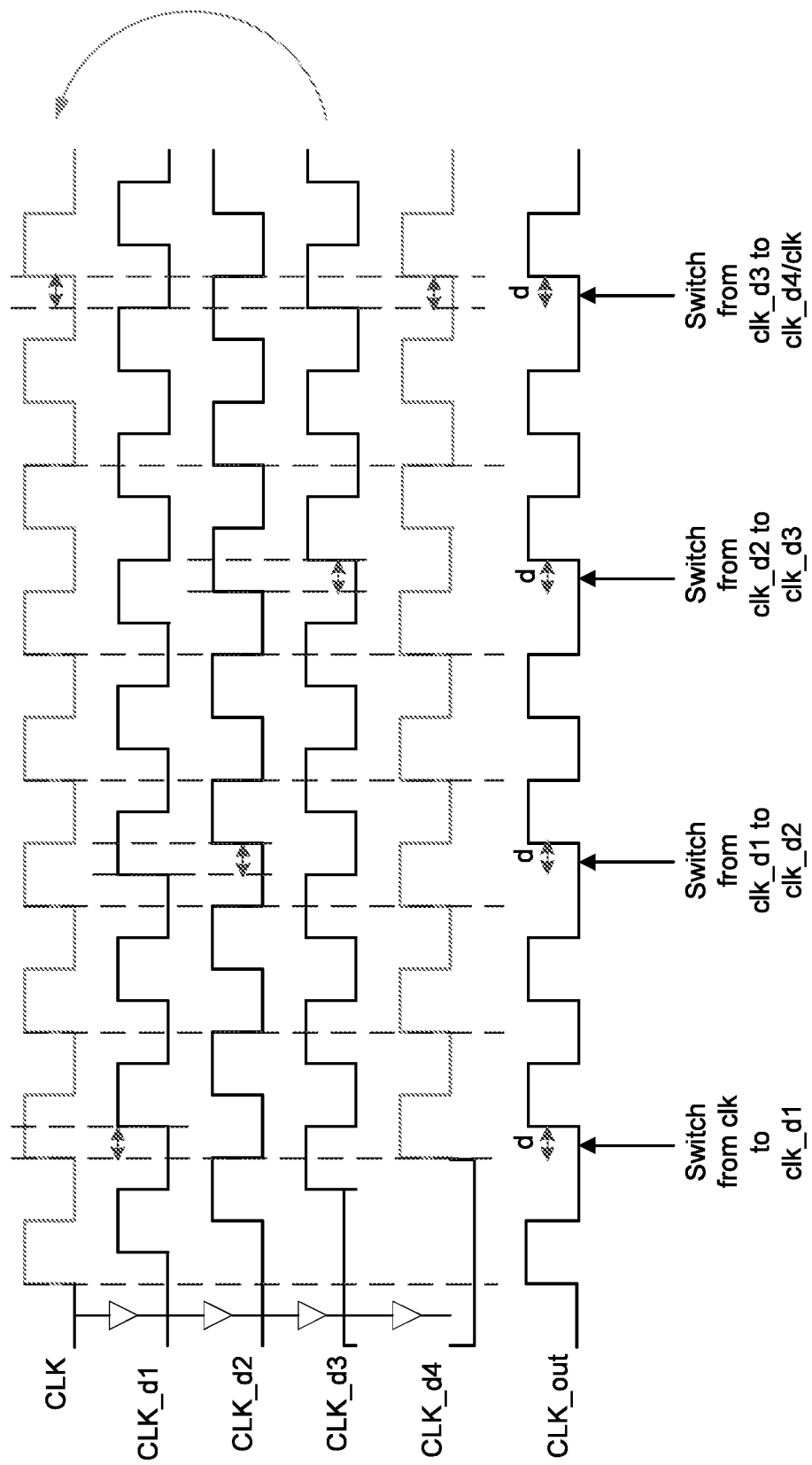
FIG. 10 illustrates an example of modifying a clock signal.

The fractional modifier 205 may be capable of modifying the clock signal by one or more than one clock period. In this example, the time comparison unit 203 may provide time differences of one or more clock periods to fractional modifier 205 instead of integral modifier 204. FIG. 10 illustrates one example of how the fractional modifier 205 can delay the clock signal by one or more clock cycles. In FIG. 10, Clk is clock signal 701, and clk_d1 to clk_d4 are delayed versions of clk. d is the buffer delay and is a quarter of the clock period in this example. That means that the number of buffers required for the fractional delay compensation is:

$$n = \frac{\text{clock\_period}}{\text{buffer\_delay}} - 1 = 4 - 1 = 3$$

Therefore, if the observed delay (e.g. estimated time comparison unit 203) is 3*d, then the following steps may be followed by the fractional modifier 205:

1. Switch clk to clk_d1
2. Switch clk_d1 to clk_d2
3. Switch clk_d2 to clk_d3

This will provide a modified clock signal that is delayed by 3*d or ¾ clock periods.

If there is a need to go further delay the clock signal by 4*d (which is equivalent to an integral delay of one clock period), then there are two options: (i) insert another delay buffer and switch from clk_d3 to clk_d4; or (ii) go back to clk.

The delay lines could be considered to be cyclic, such that going from clk_d3->clk_d4 or going from clk_d3->clk will have the same effect (since there is no fractional delay between them, just an integral one). The delay chain can go beyond that; for example, if the system has to compensate for a time difference of 1.5 clock periods (equivalent to introducing 6 time delays d into the system) the following switching chain can be implemented:

Clk->clk_*d*1->clk_*d*2->clk_*d*3->clk->
clk_*d*1->clk_*d*2.

This will provide a modified clock signal that is delayed by 6*d or 1.5 clock period.

One advantage of the cyclic nature of the delay lines is that the system can compensate for delays that are greater than one clock period without requiring additional resources such as extra delay buffers. Alternatively, the fractional modifier 205 may be provided with extra delay buffers which provide a total delay that is greater than one clock period (e.g., in a similar manner to FIG. 4*d*).

Figure 11:
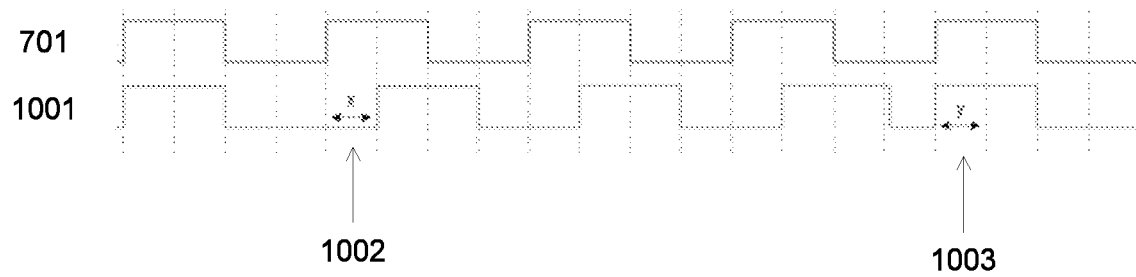
FIG. 11 illustrates an example of adding and removing time from a clock signal.

The modified clock signal output by controller 109*b* may drift over time relative to clock 105*b*. The modified clock signal may be re-synchronised with clock 105*b* by comparing the time difference between the modified clock signal and the clock signal from clock 105*b*. In this case, the modified clock signal from controller 109*b* is provided to the time marker generator 202 to generate a time marker for the modified clock signal. The generated time marker is compared with the time marker generated for clock 105*b*. If it is determined (e.g. via the time comparison unit 203) that clock 105*b* is ahead of (i.e. faster than) the modified clock signal from controller 109*b*, then the fractional clock modifier 205 may switch to a new delay line that has a smaller delay than the current delay line. The difference between the new and current delay lines would correspond to the amount of time that 105*b* is ahead of the modified clock signal. This is illustrated by the example in FIG. 11. The modified clock signal output by controller 109*b* is shown at 1001 and the original clock signal from clock 108*b* is shown at 701. At 1002, the clock signal is modified by introducing a delay of x seconds by selecting a delay line at the fractional clock modifier 205 corresponding to an x second delay. After some time, modified clock signal 1001 is compared with the clock signal from clock 105*b* (not shown) and it is determined that clock 105*b* is now y seconds faster than modified signal 1001. At 1003, modified signal 1001 is subtracted by y seconds by selecting a delay line that is y seconds less than the current x second delay line. Thus, an x-y second delay line is selected at 1003 to shift the modified clock signal 1001 by y seconds so that it synchronises with clock 105*b*.

Preferably, clock 108*b* is configured to run slightly faster than the clock that it is to be synchronised with (e.g. clock 105*b*). This may be achieved by tuning clock 108*b* so that it has a clock frequency that is a greater than the clock frequency of clock 105*b* by the smallest possible controllable increment. This helps to ensure that clock 108*b* will run ahead of clock 105*b* so that integral and/or fractional modifiers 204 and 205 can modify the clock signal from clock 105*b* by applying appropriate delays and thus provide a modified clock signal that is synchronised with clock 105*b*.

Figure 12:
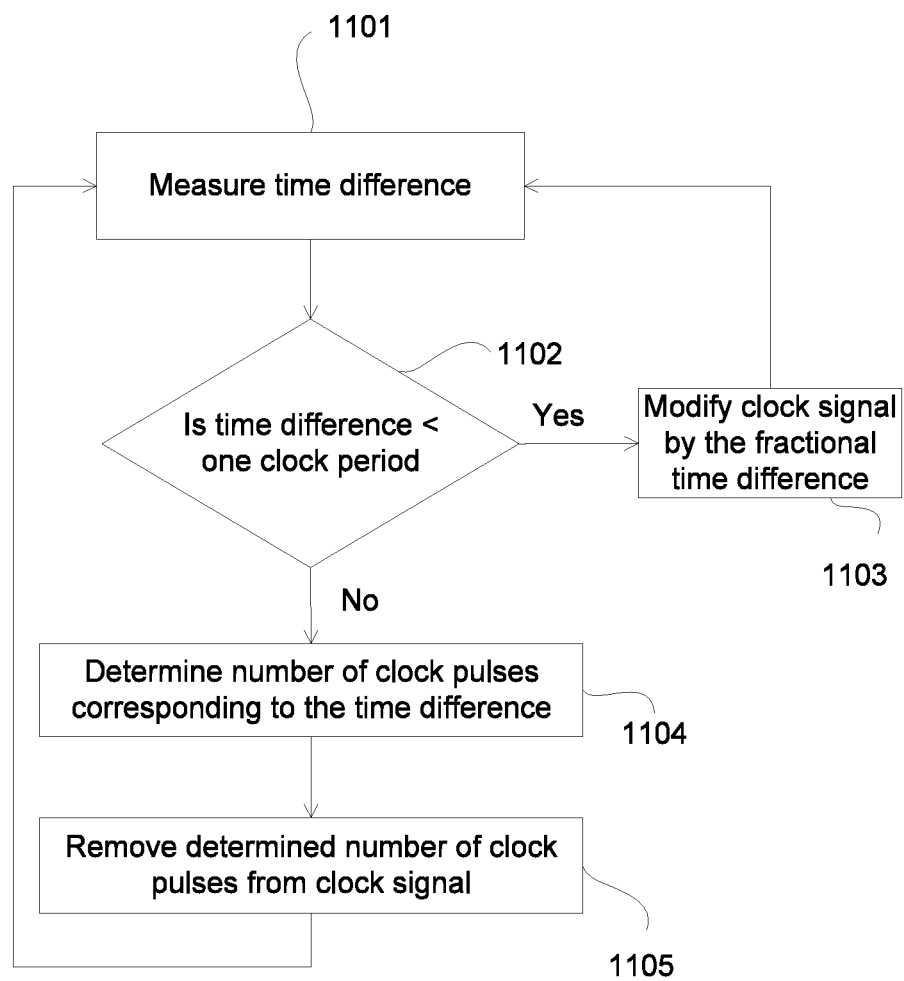
FIG. 12 shows an example process for modifying a clock signal.

FIG. 12 illustrates a process which may be performed by controller 109*b* for providing a clock signal that is synchronised with clock 105*b*. At step 1101, the time difference measurement process begins. At this step, the clock 105*b* may be compared with clock 108*b* by, for example, generating time markers (as described above) and estimating the time difference between those markers (e.g. using time comparison unit 203). At step 1102, it is determined if the estimated time difference is less than one clock period. If the time difference is less than one clock period the process moves on to step 1103. Otherwise, the process moves on to step 1104. At step 1103, the clock signal from clock 108*b* is modified by adjusting it by the estimated fractional time difference, as described above in relation to the fractional clock signal modifier 205. The process then returns to step 1101 for the processing of the next measurement. At step 1104, the number of clock pulses corresponding to the timing difference is determined. At step 1105, the determined number of clock pulses is removed from the clock signal of clock 108*b*. Alternatively, step 1105, may be performed at the fractional clock signal modifier 205, which may be capable of adjusting the clock signal by one or more than one clock period, as mentioned above. The process then returns to step 1101 for the next measurement.

The time difference measurement and clock modification approach described above may mostly be based in hardware (e.g. use of delay buffers to determine the time difference, gating the clock signal, use of delay buffers and multiplexers to modify the clock signal). This hardware approach requires minimal software intervention, which may be resource hungry and frees up the software processing resource to perform other tasks or sleep. In particular, performing regular time difference measurements using the hardware approach rather than monitoring the time difference via software saves on significant resources. This will help ensure that the modified clock signal remains in tight synchronisation with clock 105*b*. This error containment keeps the synchronised system stable and prevents error build up, which would otherwise destabilise a synchronised system. Another advantage of using a hardware based approach is that the processor can be put to sleep and may only be woken up occasionally for book-keeping. This results in a large power saving, which is particularly advantageous for improving the battery life of battery-powered devices.

The devices of FIGS. 1, 2, 4a and 8 are shown as comprising a number of functional blocks. This is schematic only and is not intended to define a strict division between different logic elements of such entities. Each functional block may be provided in any suitable manner.

Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), or the like. A computer or computer system may comprise one or more processors.

Code defining an integrated circuit may define an integrated circuit in any manner, including as a netlist, code for configuring a programmable chip, and as a hardware description language defining an integrated circuit at any level, including as register transfer level (RTL) code, as high-level circuit representations such as Verilog or VHDL, and as low-level circuit representations such as OASIS and GDSII. When processed at a suitably equipped computer system configured for generating a manifestation of an integrated circuit, code defining an integrated circuit may cause the computer system to generate a manifestation of the integrated circuit expressed by the code. Such computer systems may cause a manifestation of an integrated circuit to be generated by, for example, providing an output for controlling a machine configured to fabricate an integrated circuit or to fabricate an intermediate expression of the integrated circuit, such as a lithographic mask.

Higher level representations which logically define an integrated circuit (such as RTL) may be processed at a computer system configured for generating a manifestation of an integrated circuit in the context of a software environment comprising definitions of circuit elements and rules for combining those elements in order to generate the manifestation of an integrated circuit so defined by the representation.

As is typically the case with software executing at a computer system so as to define a machine, one or more intermediate user steps (e.g. providing commands, variables etc.) may be required in order for a computer system configured for generating a manifestation of an integrated circuit to execute code defining an integrated circuit so as to generate a manifestation of that integrated circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A circuit for estimating a time difference between an occurrence of a first event and an occurrence of a second event, the circuit comprising:
   a first time marker generator configured to generate a first time marker in response to the occurrence of the first event;
   a second time marker generator configured to generate a second time marker in response to the occurrence of the second event;
   a first signal line for receiving the first time marker;
   a delay unit configured to receive the second time marker and delay the second time marker so as to provide a plurality of delayed versions of the second time marker, each delayed version being delayed by a different amount of delay to the other delayed versions;
   a comparison unit configured to compare each of the delayed versions of the second time marker with the first time marker so as to identify which of the delayed versions of the second time marker is the closest temporally matching time marker to the first time marker; and
   a difference estimator configured to estimate the time difference between the first and second time markers in dependence on the identified delayed version;
   wherein the first event and/or the second event is one of playing a media frame or receiving a beacon, and the estimated time difference provides a measure of a time delay relative to a time of playing the media frame or a time of receiving the beacon.

2. The circuit as claimed in claim 1, wherein the estimated time difference between the first and second time markers is the amount of delay that the closest matching delayed time marker is delayed by.

3. The circuit as claimed in claim 1, wherein the delay unit comprises a series of delay signal lines, each delay signal line being configured to delay the second time marker by a different amount of delay to the other delay signal lines so as to provide the plurality of delayed versions of the second time marker.

4. The circuit as claimed in claim 3, wherein the comparison unit is configured to compare the time marker at each of the delay signal lines with the first time marker when the first time marker transitions from a first state to a second state.

5. The circuit as claimed in claim 3, wherein each delay line comprises a number of buffers, the number of buffers for each delay line being different to the number of buffers for the other delay lines, each buffer being configured to delay the second time marker by a predetermined amount of time.

6. The circuit as claimed in claim 1, wherein the delay unit is configured to provide n delayed versions of the second time marker, wherein the delay for the $i^{th}$ delayed version of the second time marker is: delay(i)=iT, where i=1, 2, 3 . . . n and T is a predetermined amount of time.

7. The circuit as claimed in claim 1, further comprising:
a second signal line for receiving the second time marker;
a second delay unit configured to receive the first time marker and delay the first time marker by a plurality of delays so as to provide a plurality of delayed versions of the first time marker, each delayed version of the first time marker being delayed by a different amount of time to the other delayed versions; and
a second comparison unit configured to compare each of the delayed versions of the first time marker with the second time marker,
wherein the difference estimator is configured to select the comparison unit or the second comparison unit for estimating the time difference between the first and second time markers.

8. The circuit as claimed in claim 1, wherein the first time marker is generated in dependence on a first clock and the second time marker is generated in dependence on a second clock.

9. The circuit as claimed in claim 8, wherein the time difference is less than a clock period of the first or second clock.

10. The circuit as claimed in claim 1, wherein the first or second time marker generator is configured to generate a pulse in response to the occurrence of the first or second event respectively and output the generated pulse as the respective first or second time marker.

11. The circuit as claimed in claim 1, wherein the first or second time marker generator is configured to change the polarity of a signal in response to the occurrence of the first or second event respectively and output the signal as the respective first or second time marker.

12. The circuit as claimed in claim 1, further comprising a controller configured to adjust the frequency of a clock in dependence on the estimated time difference.

13. A method of estimating a time difference between an occurrence of a first event and an occurrence of a second event, the method comprising:
generating a first time marker in response to the occurrence of the first event;
generating a second time marker in response to the occurrence of the second event;
receiving the first time marker;
receiving the second time marker and delaying the second time marker so as to provide a plurality of delayed versions of the second time marker, each delayed version being delayed by a different amount of delay to the other delayed versions;
comparing each of the delayed versions of the second time marker with the first time marker so as to identify which of the delayed versions of the second time marker is the closest temporally matching time marker to the first time marker; and
estimating the time difference between the first and second time markers in dependence on the identified delayed version;
wherein the first event and/or the second event is one of playing a media frame or receiving a beacon, and the estimated time difference provides a measure of a time delay relative to a time of playing the media frame or a time of receiving the beacon.

14. The method as claimed in claim 13, wherein the first or second time marker generator is configured to generate a pulse in response to the occurrence of the first or second event respectively and output the generated pulse as the respective first or second time marker.

15. The method as claimed in claim 13, further comprising adjusting the frequency of a clock in dependence on the estimated time difference.

16. A non-transitory computer readable storage medium having stored thereon computer readable instructions that, when executed at a computer system, cause the computer system to perform a method of estimating a time difference between an occurrence of a first event and an occurrence of a second event, the method comprising:
generating a first time marker in response to the occurrence of the first event;
generating a second time marker in response to the occurrence of the second event;
receiving the first time marker;
receiving the second time marker and delaying the second time marker so as to provide a plurality of delayed versions of the second time marker, each delayed version being delayed by a different amount of delay to the other delayed versions;
comparing each of the delayed versions of the second time marker with the first time marker so as to identify which of the delayed versions of the second time marker is the closest temporally matching time marker to the first time marker, and
estimating the time difference between the first and second time markers in dependence on the identified delayed version;
wherein the first event and/or the second event is one of playing a media frame or receiving a beacon, and the estimated time difference provides a measure of a time delay relative to a time of playing the media frame or a time of receiving the beacon.

17. The method as claimed in claim 13, wherein the first or second time marker generator changes the polarity of a signal in response to the occurrence of the first or second event respectively and outputs the signal as the respective first or second time marker.

18. The method as claimed in claim 13, wherein the estimated time difference between the first and second time markers is the amount of delay that the closest matching delayed time marker is delayed by.

* * * * *